United States Patent
Saito et al.

(10) Patent No.: US 7,636,879 B2
(45) Date of Patent: Dec. 22, 2009

(54) ERROR CORRECTION DECODER

(75) Inventors: Toshiyuki Saito, Kokubunji (JP);
Takashi Yano, Tokorozawa (JP);
Tsuyoshi Tamaki, Hachioji (JP)

(73) Assignee: Hitachi Communication Technologies, Ltd., Tokyo (JP)

( * ) Notice: Subject to any disclaimer, the term of this patent is extended or adjusted under 35 U.S.C. 154(b) by 426 days.

(21) Appl. No.: 11/196,410

(22) Filed: Aug. 4, 2005

(65) Prior Publication Data
US 2006/0161834 A1 Jul. 20, 2006

(30) Foreign Application Priority Data
Jan. 17, 2005 (JP) ............... 2005-008512

(51) Int. Cl.
*H03M 13/00* (2006.01)
(52) U.S. Cl. ............... 714/795; 714/794; 714/796
(58) Field of Classification Search ............... 714/795, 714/794, 796
See application file for complete search history.

(56) References Cited

U.S. PATENT DOCUMENTS

| | | | | | |
|---|---|---|---|---|---|
| 5,375,129 | A | * | 12/1994 | Cooper | 714/795 |
| 5,432,820 | A | * | 7/1995 | Sugawara et al. | 375/341 |
| 5,502,735 | A | * | 3/1996 | Cooper | 714/794 |
| 5,859,861 | A | * | 1/1999 | Oh | 714/795 |
| 5,946,361 | A | * | 8/1999 | Araki et al. | 375/341 |
| 5,960,011 | A | * | 9/1999 | Oh | 714/789 |
| 5,974,091 | A | * | 10/1999 | Huff | 375/265 |
| 5,991,343 | A | * | 11/1999 | Oh et al. | 375/341 |
| 5,995,562 | A | * | 11/1999 | Koizumi | 375/341 |
| 6,031,876 | A | * | 2/2000 | Oh et al. | 375/265 |
| 6,088,404 | A | * | 7/2000 | Jekal | 375/341 |
| 6,094,739 | A | * | 7/2000 | Miller et al. | 714/792 |
| 6,108,811 | A | * | 8/2000 | Nakamura et al. | 714/795 |
| 6,134,697 | A | * | 10/2000 | Jekal | 714/792 |
| 6,141,384 | A | * | 10/2000 | Wittig et al. | 375/240.25 |
| 6,445,755 | B1 | * | 9/2002 | Chung et al. | 375/341 |
| 6,477,680 | B2 | * | 11/2002 | Mujtaba | 714/795 |
| 6,484,283 | B2 | * | 11/2002 | Stephen et al. | 714/786 |
| 6,487,694 | B1 | * | 11/2002 | Bajwa | 714/786 |

(Continued)

FOREIGN PATENT DOCUMENTS

JP    2000341137 A   * 12/2000

(Continued)

OTHER PUBLICATIONS

Near Shannon Limit Error-Correcting Coding and Decoding: Turbo-Codes (1), by Berrou, et al. pp. 1064-1070. 1993 IEEE.

(Continued)

*Primary Examiner*—Joseph D Torres
(74) *Attorney, Agent, or Firm*—Brundidge & Stanger, P.C.

(57) ABSTRACT

An error correction decoder possessing a decoding method with high error correction performance and capable of operating at a low operating frequency and on a reduced circuit scale. A decoding method based on the SOVA method for improving error correction performance and boosting reliability of the soft decision output by allowing branching of paths other than the survival path at trace-back is achieved by preparing a trace-back circuit for each state, and selecting an output from that output and survival state (survival state+difference of likelihood).

7 Claims, 15 Drawing Sheets

U.S. PATENT DOCUMENTS

| | | | | |
|---|---|---|---|---|
| 6,668,026 B1 * | 12/2003 | Miyauchi | ............... | 375/341 |
| 6,690,737 B1 * | 2/2004 | Kim | ............... | 375/265 |
| 6,697,443 B1 * | 2/2004 | Kim et al. | ............... | 375/341 |
| 7,032,163 B2 * | 4/2006 | Yano et al. | ............... | 714/786 |
| 7,085,992 B2 * | 8/2006 | Becker et al. | ............... | 714/795 |
| 7,120,207 B2 * | 10/2006 | Nordman | ............... | 375/341 |
| 7,222,288 B2 * | 5/2007 | Varma et al. | ............... | 714/795 |
| 7,237,180 B1 * | 6/2007 | Shao et al. | ............... | 714/778 |
| 7,246,298 B2 * | 7/2007 | Chiueh et al. | ............... | 714/755 |

FOREIGN PATENT DOCUMENTS

JP        2002217748 A    *    8/2002

OTHER PUBLICATIONS

"A Low Complexity Soft-Output Viterbi Decoder Architecture" by Berrou, et al. pp. 737-740. IEEE 1993.

"On the Equivalence Between SOVA and Max-Log-Map Decodings" by Fossorier, et al. pp. 137-139. IEEE 1998.

* cited by examiner

FIG. 2
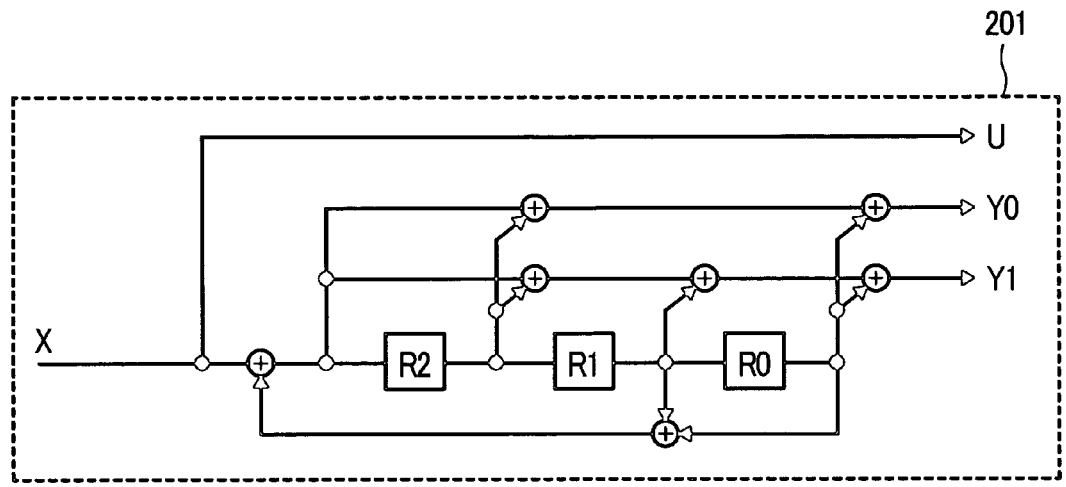
RECURSIVE SYSTEMATIC CONVOLUTIONAL CODER (K=4)
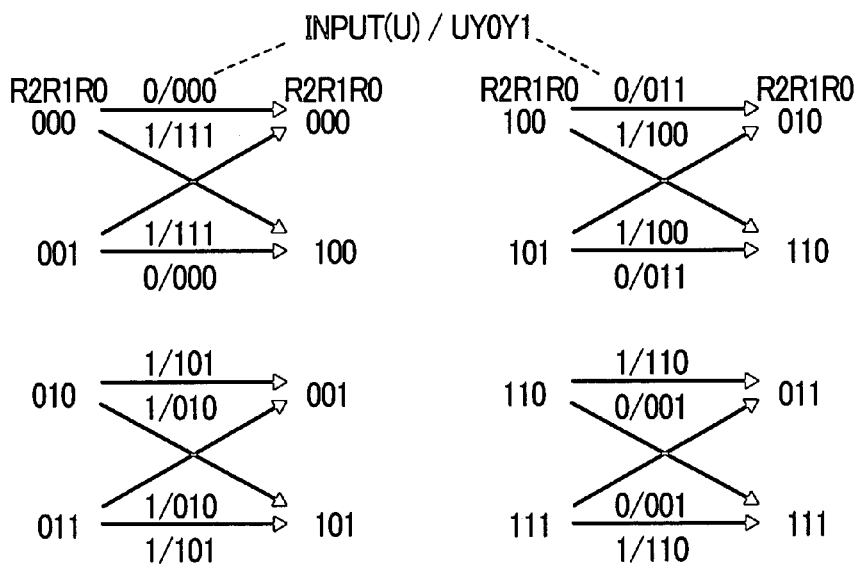

$u_j^m$ : DECODING OUTPUT OF PATH-m AT BIT=j $L_j^1$ : DELTA INFORMATION (DIFFERENCE OF LIKELIHOOD BETWEEN PATH-1 AND PATH-m) WHEN IT BRANCHED OFF

| STATE TRANSITION | m (BRANCH METRIC) CALCULATION |
|---|---|
| 0 → 0, 1 → 4 | C0 + C1 + C2 |
| 0 → 4, 1 → 0 | − C0 − C1 − C2 |
| 2 → 1, 3 → 5 | − C0 + C1 − C2 |
| 2 → 5, 3 → 1 | C0 − C1 + C2 |
| 4 → 2, 5 → 6 | C0 − C1 − C2 |
| 4 → 6, 5 → 2 | − C0 + C1 + C2 |
| 6 → 3, 7 → 7 | − C0 − C1 + C2 |
| 6 → 7, 7 → 3 | C0 + C1 − C2 |

ERROR CORRECTION DECODER

CLAIM OF PRIORITY

The present invention claims priority from Japanese application JP 2005-008512 filed on Jan. 17, 2005.

FIELD OF THE INVENTION

The present invention relates to an error correction decoder for correcting transmission errors in encoded data that was received, and relates in particular to an error correction device utilizing a turbo-decoding method.

BACKGROUND OF THE INVENTION

Communication systems utilize various types of error correction decoding methods for obtaining correct decoding results from data in which transmission errors have occurred. One decoding method for example possessing high error correction performance is known as the turbo decoding method and is disclosed by Yamaguchi and one other author, in the article "Near Shannon Limit Error—Correcting coding and decoding: Turbo-codes (1), Claude Berrou et al. Proc. IEEE 1993 (non-patent document 1). In the communications system shown in FIG. 1, the turbo coder 101 includes two recursive systematic convolutional coders 1 and 2 reference numerals 104 and 106, respectively. The convolutional coder 1 (104) encodes the signal from the information source in the order that it was input. Before being input to the convolutional coder 2 (106), the information source signals are accumulated temporarily in the memory, and are then extracted in sequence according to a pattern and their data sequence (signals) randomized by an interleaver (105) and then encoded by a convolutional coder 2 (106). The coded data U, Y0, Y1, Y2, Y3 from the two coded outputs are sent on a channel (102). The coded data U', Y0', Y1', Y2', Y3' is input by way of this channel (102) to the turbo decoder (103), and the decoded data U" restored by decoding the turbo code.

The turbo decoder (103) includes decoders 1, 2 (107, 109) and, interleavers (108, 111) and deinterleavers (110, 112). In the decoder 1 (107), U', Y0', Y1' equivalent to the transmit data U, Y0, Y1 is input and soft-decision decoding performed. Here, Y2', Y3' are equivalent to the transmit data Y2, Y3 from the interleaved and convolutional coded original signal X; the decoded data from the decoder 1 (107) is interleaved by the interleaver (108) so as to correspond to the Y2', Y3' and input to the decoder 2 (109), and soft-decision decoding performed. The output from the deinterleaver (110) that was deinterleaved to correspond to the original data sequence is once again input to the decoder 1 (107) as apriori likelihood (weight) information and the same operation repeated. The hard decision result output of the soft-decision decoding are deinterleaved by the deinterleaver (112) and acquired as the decoded output U". Randomly occurring random errors and burst errors occurring in bursts can be corrected by repeating this decoding process multiple times. The decoders 1 and 2 are identical so in this embodiment so that in many cases during actual use, the decoders are used by alternately switching one decoder between a decoder 1 (for example used at even-numbered times) and a decoder 2 (for example used at odd-numbered times).

Typical decoding methods for the decoders 1, 2 are for example, the MAP (Maximum A Posteriori) decoding method and the SOVA (Soft Output Viterbi Algorithm) decoding method. The MAP decoding method calculates the forward path metric a and the backward path metric by utilizing the shift rate of the received data, and by using the forward path metric a and the backward path metric b over time (bit), finds the differential soft decision value versus that larger probability (hard decision value) finds of becoming a "1" or a "0".

The SOVA decoding method is shown by Claude Berrou et al. in "A Low Complexity Soft-Output Viterbi Decoder Architecture", Proc. IEEE, 1993 (non-patent document 2). A convolution coder conforming to 3GPP2 C. S0024-A and a trellis graph for that coder are shown in FIG. 2 using a convolutional coder as an example. When a signal is input to the decoder, tap state transitions in the convolution coder (201), and a state exists as $2^{(k-1)}$ when the constraint length is K. In FIG. 2, the convolutional coder K constraint length equals 4. When the tap state in FIG. 3, becomes 000, 001, 010, 011, 100, 101, 110, 111 then these are respectively defined as State 0, State 1, State 2, State 3, State 4, State 5, State 6, and State 7. When an input signal of 0 is input in the State 6, then a "001" is output as the convolutional output and the next State 7 is attained. When a bit=(−1) is input at the point in time of State 6, and a bit=0 is input at the point in time of State 7, then a transition from State 6 to State 7 occurs due to the input signal 0. The input signal string can be found by following the reverse of this transition state. Moving back through the transition states is called trace-back.

An overview of the trace-back operation in the SOVA decoding method is shown in FIG. 3. By first of all investigating the possibility of a transition change on a bit string from convolutional signals input to the decoder, up to Bit=(−N) in states where Bit=0 is State 1, Bit=(−1) is State 2, and Bit=(−2) is State 5, the bit string estimated to have been input can be output as a hard decision (solid line numerals on the path are estimated values) by the most likely survival path. When an error is assumed to have occurred in the estimate of the input signal from Bit=(−1) to Bit=0, then there may have been another transition shift so along with following the survival path, the transition shifts are investigated according to the survival path and reverse path information from Bit=(−1) to Bit=0, and this then followed (traced) as the concurrent path (dotted line). An operation generating a concurrent path is called a path branching. These branches are generated at each of the bits Bit=0, (−1), (−2), and path weight (path metric) information equivalent to the difference in likelihood versus the survival path is collected, and established as the soft decision value.

Making a trace-back of two paths (survival path and concurrent path) at once and comparing them in this way, requires two trace-back operations for establishing soft-decision results for 1 bit so that the calculation efficiency drops and time is required to establish all the soft decision outputs. A method was therefore proposed (JP-A No. 217748/2002) for performing trace-backs simultaneously on multiple paths by parallel trace-back circuit operation per the number of states to increase efficiency and achieve high-speed operation. The SOVA method only performs trace-back from the second likely path for each bit so that the error correction capability is essentially inferior to the MAP method that handles all paths but possesses the advantage of a small calculation load.

FIG. 4 however shows a method that generates branches even on concurrent paths for trace-back, to improve the error correcting capability even from the third likely path onward as described by Marc P. C. Fossorier, Frank Burkert, Shu Lin, Joachim Hagenauer: "On the Equivalence Between SOVA and Max-Log-MAP Decodings", IEEE Communication Letters, vol. 2, pp. 137-139, May 1998 (non-patent document 3) (FIG. 4 is a graph for the operation of non-patent document 3.) Here, path-1 is the survival path, path-2, path-m are concurrent paths, and path-n is the branch from path-2 serving as a concurrent path. Paths $u_j$ different from $u_j^1$ are increased to account for the path-n, and by increasing potential paths, soft-decision output values are likely to have improved reliability. However, in this case, the number of branches from concurrent paths increase according to the length to where they merge with the survival path, so that there may be an enormous increase in the number of concurrent paths that must be traced at the same time.

[Non-patent document 1] "Near Shannon Limit Error—Correcting coding and decoding: Turbo-codes (1), Claude Berrou et al. Proc. IEEE 1993.

[Non-patent document 2] Claude Berrou et al., "A Low Complexity Soft-Output Viterbi Decoder Architecture", Proc. IEEE, 1993.

[Non-patent document 3] Marc P. C. Fossorier, Frank Burkert, Shu Lin, Joachim Hagenauer: "On the Equivalence Between SOVA and Max-Log-MAP Decodings", IEEE Communication Letters, vol. 2, pp. 137-139, May 1998.

SUMMARY OF THE INVENTION

The SOVA decoding method using parallel trace-back circuits (for example in JP-A No. 217748/2002) and the MAP method have a tradeoff relationship with error correction capability in terms of the operating frequency and the number of identical repeating decodings. Achieving a SOVA method possessing approximately the same error correcting capability as the MAP method requires either increasing the number of repetitive decodings where the decoding output is re-input to the decoder, or increasing the electrical power of the signal. Increasing the number of repeated decodings requires a high operating frequency due to the time required for decoding. Increasing the signal electrical power requires increasing the power consumption on the transmit side. Low power consumption is a critical issue in the case of mobile terminals so that the power consumption is a problem in either case.

When the paths are increased to contribute to the output of soft-decision output power candidates as shown in non-patent document 1, an error correcting capability largely equivalent to the MAP method is obtained. However this method possesses problems such as the need to increase the number of trace-back circuits as the number of concurrent paths are increased, and the fact that a high operating frequency is needed due to the quantity of calculations required to establish soft-decision results for one bit, etc.

The present invention therefore has the object of providing a SOVA decoding method with high error correction performance and capable of operating at a low operating frequency, and on a reduced circuit scale.

In order to eliminate the above problems with the related art, the present invention establishes the survival state flag of present state, survival state (weight), estimated binary input value, output path survival flag and path weight, based on the path information and difference of likelihood (or path metric) during ACS operation state, and the path weight and survival path flag on the input path. The output path weight (likelihood) prepares trace-back calculating sections (for selecting and outputting a weight state (weight state+difference in likelihood) according to the path information) that equal in number to the number of states and performs parallel processing. The trace-back calculating section of this invention as shown in FIG. 10, respectively sets the weight state in the trace-back according to the path information, and the (weight state+difference in likelihood) in the reverse paths, as the path weights. The soft-decision candidates can in this way all be output during trace-back, and therefore soft decision values can be found with high accuracy. The technology of the related art required raising the operating frequency and increasing the number of trace-back circuits in order to improve error correction performance. However, this invention can achieve error correction performance equivalent to that of the MAP system while maintaining a low operating frequency.

This invention renders the effect of improving error correction performance in turbo decoder utilizing the SOVA method to the same or higher standards than the MAP method, reduced the quantity of decoding processing calculations, and lowers the required operating frequency for digital signal processing.

BRIEF DESCRIPTION OF THE DRAWINGS

FIG. 2 is an example of the convolutional coder (supporting 3GPP2 C.S0024-A) and its trellis diagram;

DETAILED DESCRIPTION OF THE PREFERRED EMBODIMENTS

Figure 1:
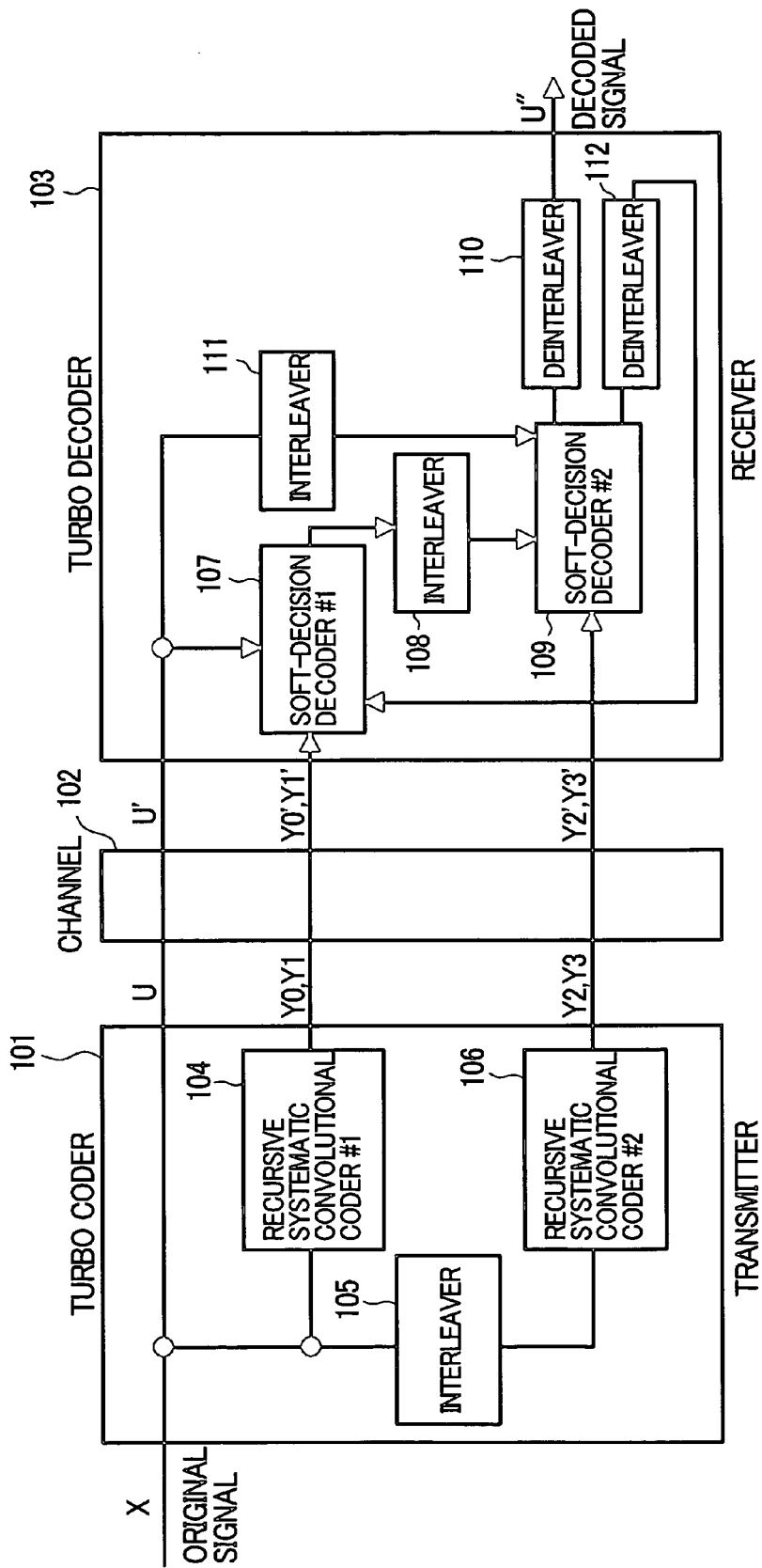
FIG. 1 is a block diagram of the communication system utilizing the turbo coding.
Figure 3:
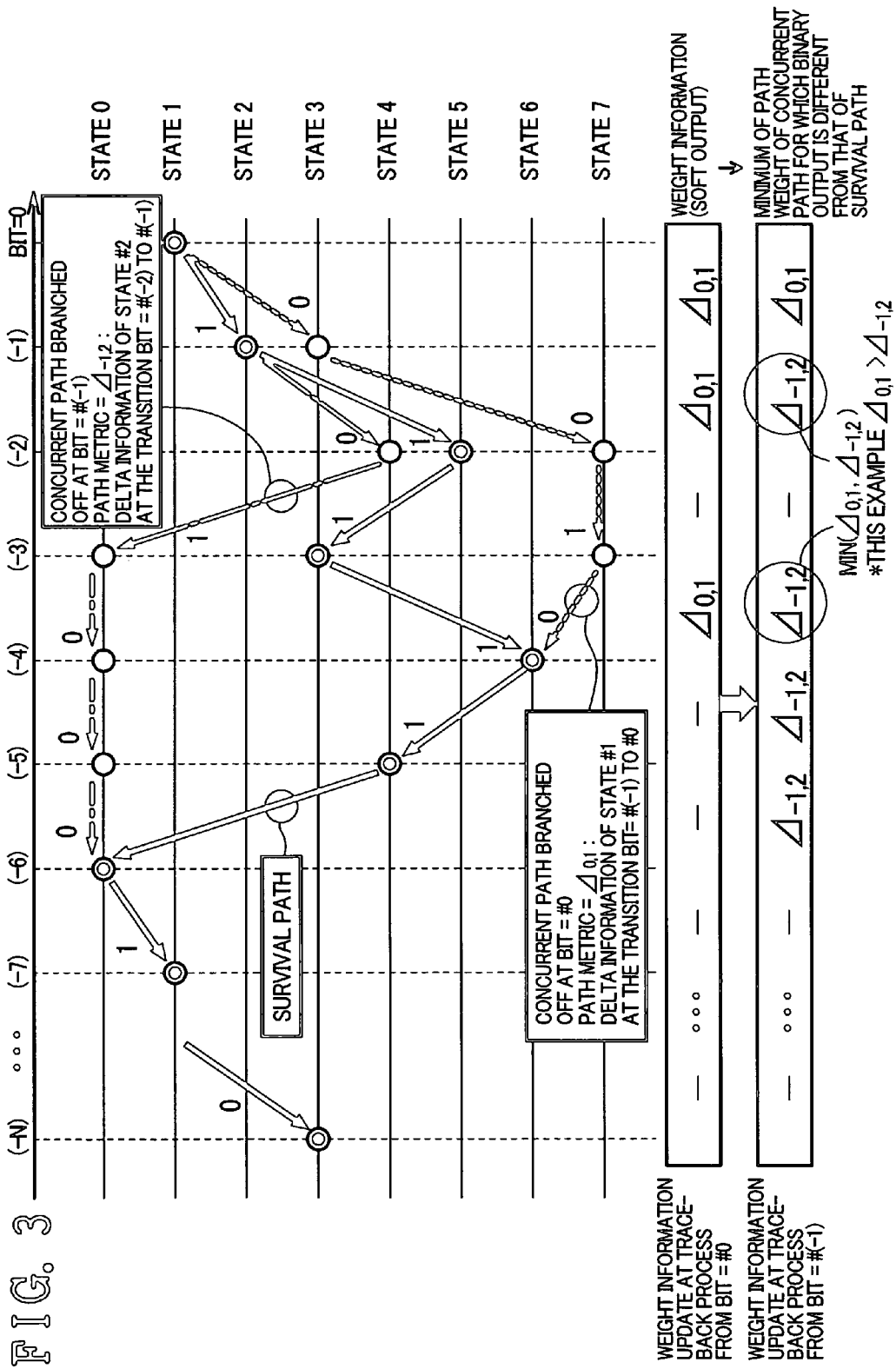
FIG. 3 is concept block diagram of the trace-back processing in the related art (SOVA method)
Figure 4:
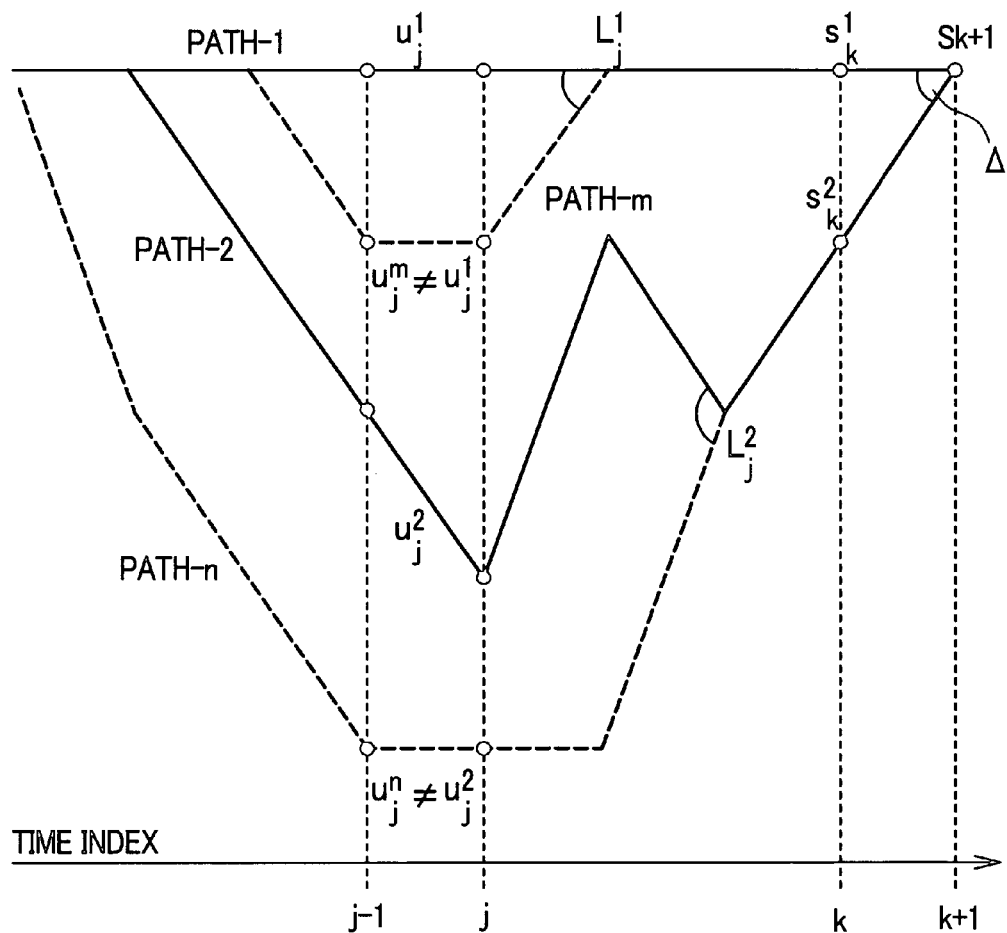
FIG. 4 is a concept diagram of the trace-back processing of the related art (Bi-Directional SOVA method)
Figure 5:
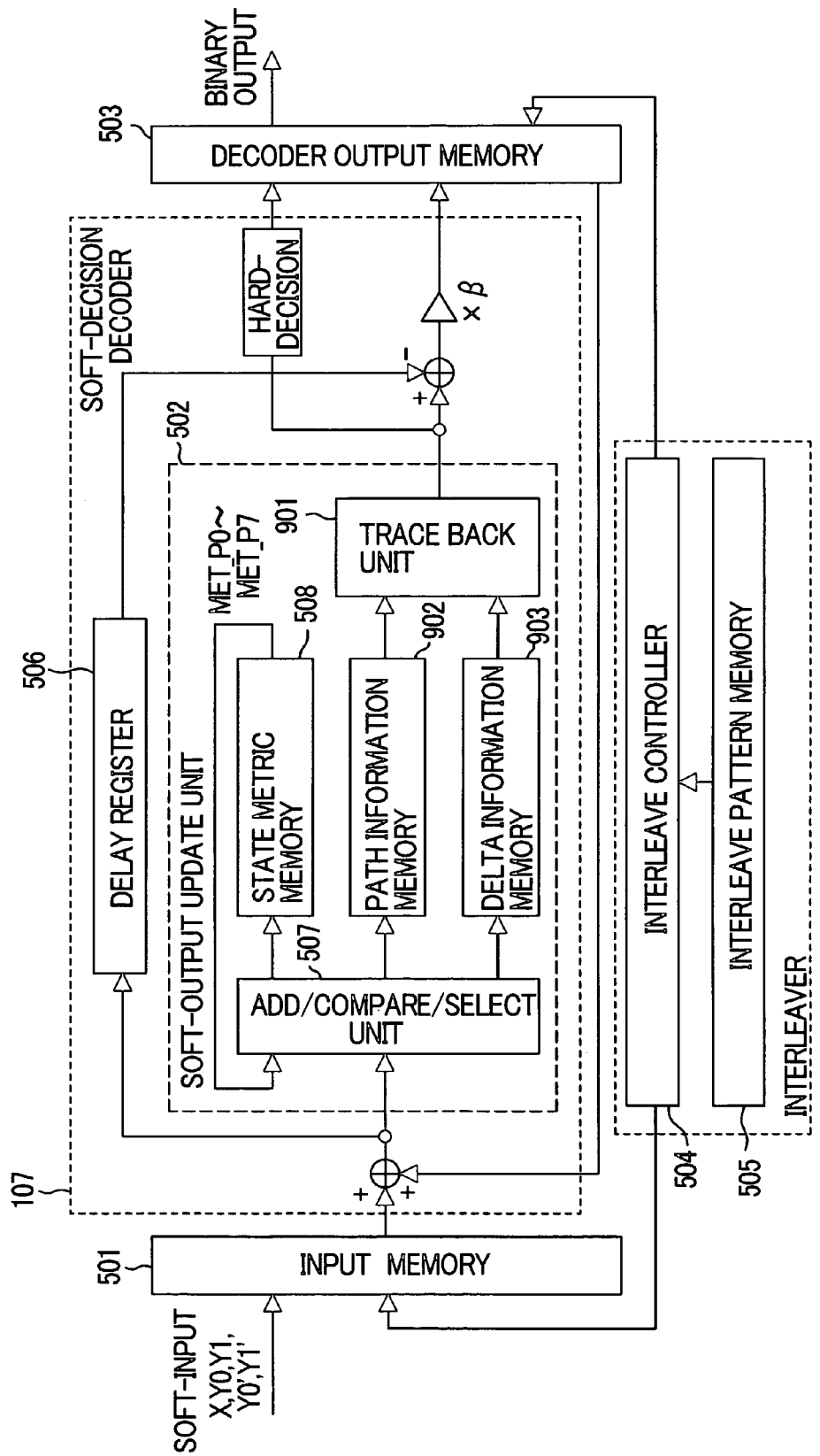
FIG. 5 is a structural diagram of the turbo decoder of this invention.

FIG. 5 is a block diagram showing an embodiment of the turbo decoder (103) of this invention. This decoder is comprised of an input buffer memory 501 for storing received turbo coded data portions as soft decision inputs of the decoder; and a soft decision decoder 107, and a decoder output memory 503 for storing as outputs, the soft decision values and hard decision values resulting from soft decision decoding, and an interleave controller 504 for controlling the addresses according to the interleave pattern sequence when making the specified number of repetitive calculations of decoding results and soft decision information, and an interleave pattern memory 505 for storing the interleave patterns. The functions of the interleavers 107, 108, and the deinterleavers 110, 111 shown in FIG. 1 can be implemented by controlling the addresses according to the interleave pattern sequence with the interleave controller 504, to regulate the flow of data according to the number of repetitive decodings. The soft decision decoder 107 contains a soft-output update unit 502 and a delay resistor 506. The soft decision decoder 107 stores the a priori information for the next stage and the hard decision results from the input weight information delayed by the delay register 506 and output weight information from the soft output update unit 502, into the decoder output memory 503. By loading the hard decision results according to the sequence specified by the interleaver controller from the decoder output memory, the hard-decision output U" of the soft decision input U' is obtained.

Figure 6:
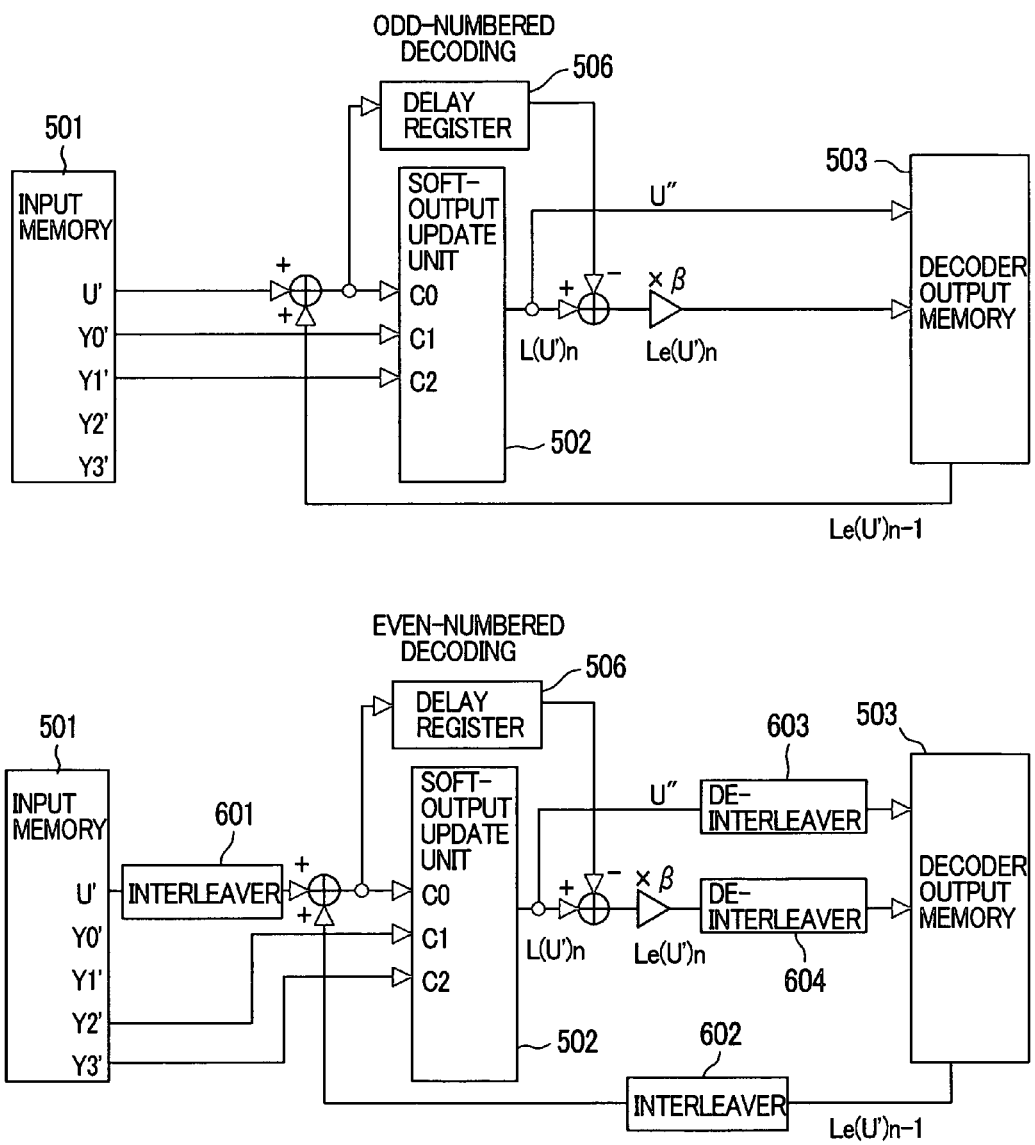
FIG. 6 is a block diagram for describing the operation during turbo repetitive decoding in this invention.

The data flow is described while referring to FIG. 6. In the repetitive processing for odd-numbered decoding, the U', Y0', Y1' that are values loaded in their address sequence from the input memory 501 where turbo coded data received via the channel is stored, are used as the C0, C1, C2 inputs to the soft output update unit 502. After subtracting the apriori weight information $L_e(U')_{n-1}$ and U' from the output L (U')$_n$ of soft output update unit 502, the external information weight $L_e(U')_n$ is set equal to $\beta \times \{L(U')_n - U' - L_e(U')_{n-1}\}$ and written along with the hard decision results of $L(U')_n$ in address sequence in the decoder output memory 503. The apriori weight information $L_e(U')_{n-1}$ is set to 0 at the first repetitive decoding. Here, $\beta$ is the weighting coefficient for the degree of reliability matching the soft decision value. This value affects the error correction characteristics. This coefficient $\beta$ is used to measure the state of the noise on the channel from the bit error rate of the error correction results, to adaptively control the noise.

Next, in the repetitive processing for even-numbered decoding, the U', which is a value loaded from the input memory 501 according to the interleave pattern by the interleaver 601, is input as C0 to the soft output update unit 502; and the values Y2', Y3' loaded in their address sequence are respectively used as C1, C2. The apriori weight information $L_e(U')_{n-1}$ uses a value loaded according to the interleave pattern by the interleaver 602 from the decoder output memory 503 using the external information weight obtained in the prior decoding. After subtracting the apriori weight information $L_e(U')_{n-1}$ and U' from the output L (U')$_n$ of soft output update unit 502, the external information weight $L_e(U')_n$ is set equal to $\beta \times \{L(U')_n - U' - L_e(U')_{n-1}\}$ and written along with the $L_e(U')_n$ hard decision results U'" in the address according to the interleave pattern from the deinterleavers 603, 604 in the decoder output memory 503. The delay register 506 is a circuit for delaying operation until the output $L_e(U')_n$ from the soft output update unit 502 is found from the sum of the C0 input to the soft output update unit 502 and the apriori weight information $L_e(U')_{n-1}$.

The operation during the repetitive decoding by the interleave controller 504 and the interleave pattern memory 505 in FIG. 5, with at method utilizing the functions of the interleavers 601, 602 and the deinterleavers 603, 604 is described next. In the repetitive processing for odd-numbered decoding, addresses are generated in synchronization with the signal processing timing of the interleave controller 504, so that the read-out address of the input memory 501, and the read-out address and write address of the decoder output memory 503 are all increased by one each in their address order. In the repetitive processing for even-numbered decoding, addresses are generated in synchronization with the signal processing timing of the interleave controller 504 for each memory, so that the values read-out with interleave patterns in the address order of interleave pattern memory 505, become the read-out address of the input memory 501, and the read-out address and write address of the decoder output memory 503, to achieve the functions of the interleavers 601, 602 and the deinterleavers 603, 604. In other words, the interleavers 601, 602 and the deinterleavers 603, 604 of FIG. 6 are expressed by the interleave controller 504 and the interleave pattern memory 505.

The soft output update unit 502 of FIG. 5 is described next. The soft output update unit 502 includes an ACS (Add-Compare-Select) circuit 507, and a state metric memory 508 for storing metric values found by the ACS circuit 507, and a path information memory 902 for storing path values, and a Delta information memory 903 for storing the difference in likelihood, and a trace-backer 901 for following the path of the most likely transition from the path value. The soft output update unit 502 finds the transition likelihood (metric value), and transition information (path information), and delta (weight) information equivalent to the difference in likelihood for a transition from one state to another, for all the transition states.

Figure 7:
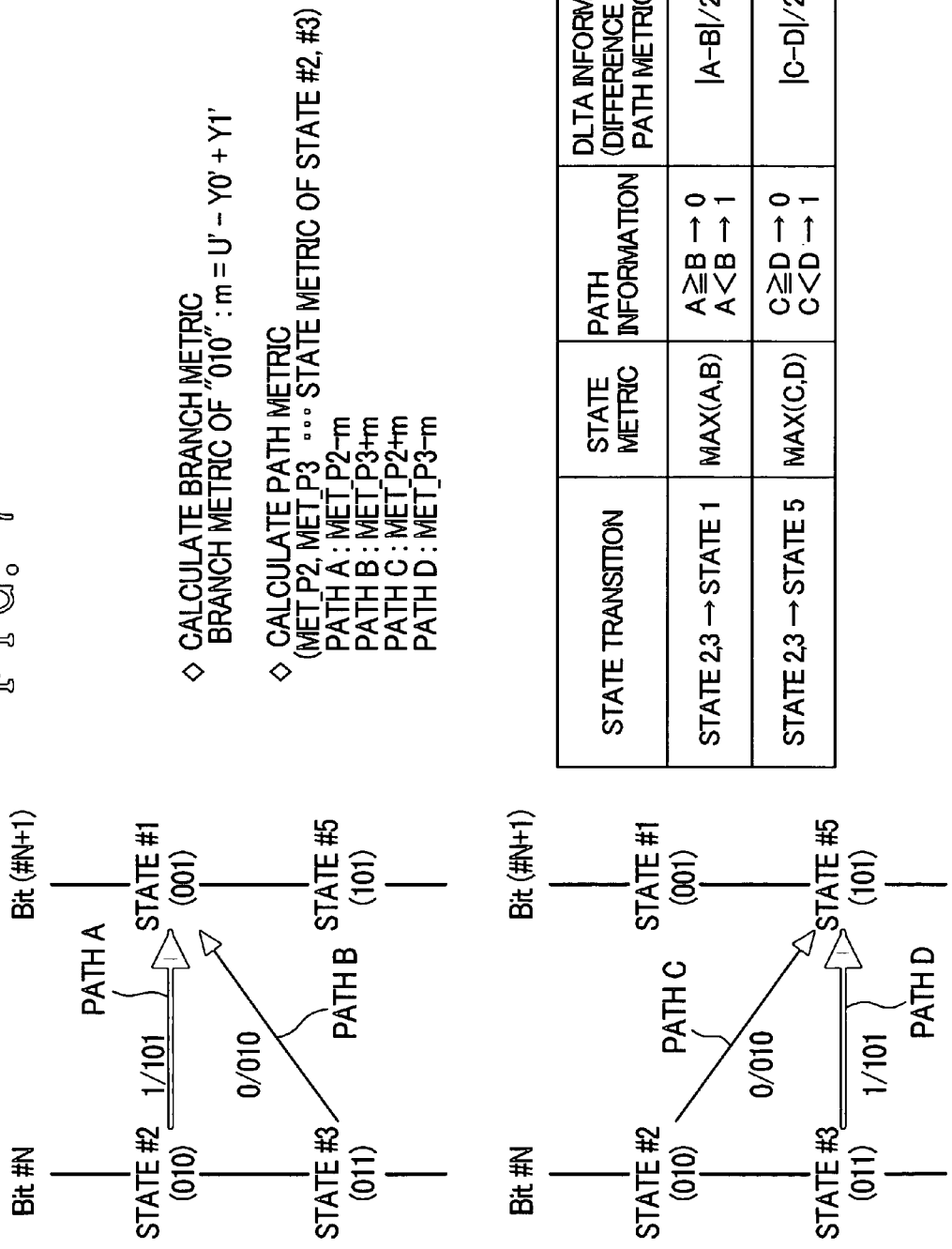
FIG. 7 is a diagram of the turbo decoder ACS circuit of this invention.

An example of the embodiment of the ACS circuit 507 is shown in FIG. 7. The ACS circuit 507 first of all finds the likelihood m of each transition branch for the basic state transition structure (butterfly), as a function of the C0, C1, C2 inputs to the soft decision decoder. The metric values MET_P0, MET_P1 corresponding to the binary states on the input side, are loaded from the state metric memory 508 that stores the metric values of FIG. 5, and metric values corresponding to the binary states on the input side are set in the ACS circuit. Here, among the metric values stored in the state metric memory 508 and calculated one bit prior (state before transition) in the ACS circuit, the MET_P0, MET_P1 are metric values selected to correspond to the matching binary states on the input side of the ACS circuit.

FIG. 7 shows that there is a transition to state 5 when a "0" input signal has been input for the state 2, and that there is also a transition to state 5 when a "1" input signal has been input for the state 3. At this time, there are two cases for a transition to the state 5; one case is a transition from a state 2 to a state 5 and the other is a transition from a state 3 to a state 5. The likelihood for a path C in a transition from state 2 to state 5 is expresses as C=MET_P2+m, with m equal to C0−C1+C2. The likelihood for path D in a transition from state 3 to state 5 is expressed as D=MET_P1−m. When the likelihood of a transition for these two states are compared, the path D is larger than C in the example in FIG. 7 so that the transition from state 3 to state 5 is likely. In the same way, examining the possibility for a shift at state 1 reveals that the transition from the state 2 to the state 1 in FIG. 7 is likely.

Figure 8:
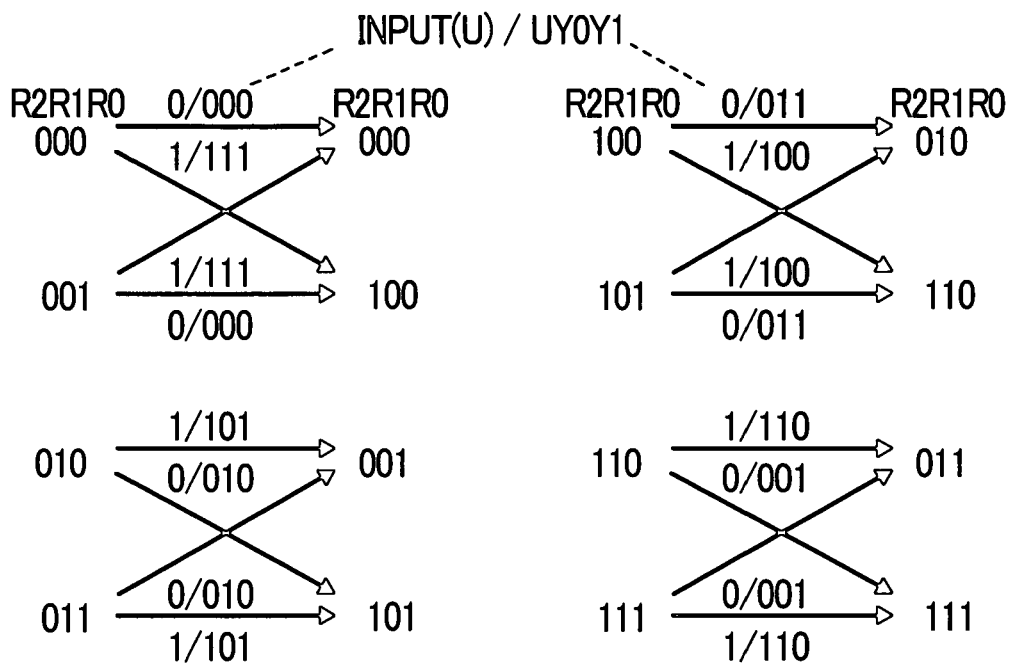
FIG. 8 is a diagram and table showing the method for calculating the branch metric of the turbo decoder ACS circuit of this invention.

The likely routes of state transitions are shown by a thick line in FIG. 7. In FIG. 7, D possesses a larger transition likelihood than C, and so is defined by setting the path value to 1 since the transition is from a state with the larger state number. Conversely, when C is larger, then the path value is set to 0. In the same way, when the transition likelihood of A and B are compared, the path value transitioning to the state 4 is set to 0 when A is larger than B, and is set to 1 when A is smaller than B. The value obtained after dividing the absolute value for the transition difference in likelihood between C and D by two, is set as the difference in likelihood (delta information) for state 5, and in the same way, the value obtained by dividing the absolute value of the difference between A and B by two, is set as the difference in likelihood (delta information) for state 1. The metric value, path value, difference in likelihood (delta information) for all states are found in the ACS circuit, and stored respectively in the state metric memory 508, path memory 902, and delta information memory 903. To avoid saturating the metric value, the metric value having the largest maximum value one bit prior (state before transition) in the ACS circuit processing is stored, and after subtracting that stored metric value from each metric value, the value may be stored in the state metric memory 508. The function for finding m from C0, C1, C2 is determined according to the structure of the coder. One example of specifications for the 3GPP2 C.S 0024-A turbo coder are shown in the trellis diagram of FIG. 8.

Figure 9:
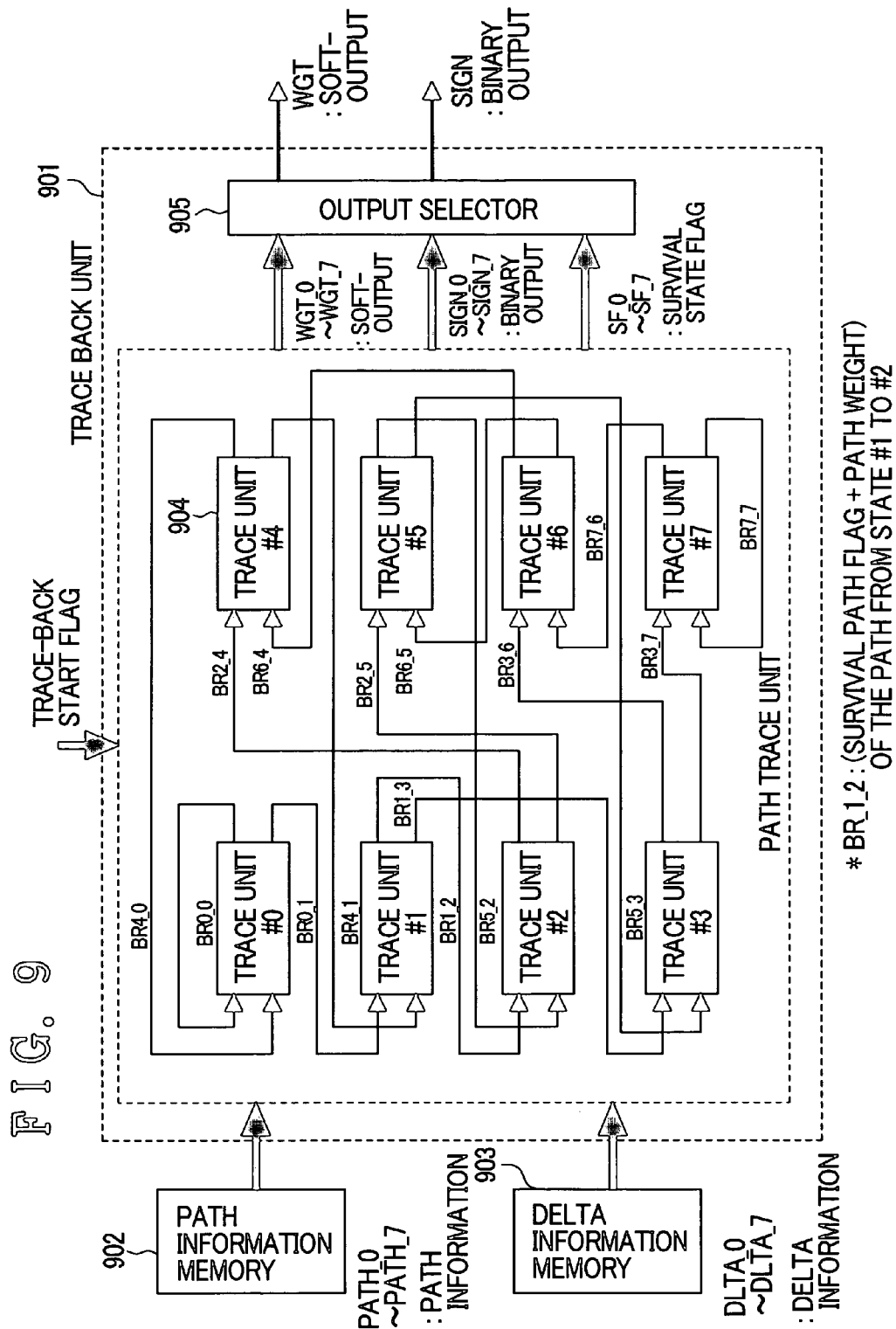
FIG. 9 is a diagram showing the trace-back circuit of the turbo decoder embodiment of this invention.

FIG. 9 is a block diagram for describing the embodiment of the trace-back circuit. The initial state of the trace-back circuit 901 is set by the trace-back start flag, and the hard decision (binary output) value SIGN and soft decision value WGT (also called soft output) are found by using the path values and difference in likelihood (or delta information) for each state output respectively from the path memory 902 and delta information memory 903.

The trace-back circuit 901 is comprised of multiple trace units 904 and one output selector 905. The trace unit 904 is a circuit for finding the survival path flag for the current state, the hard decision value SIGN (binary output), the soft decision output WGT, and the path weight information and survival path flag for each output path based on the path weight information and the survival path flag for each input state. Here, the survival path flag is a flag expressing the most likely path transition, and the survival state flag is a flag expressing the input state on the survival path. The information found in each trace unit 904 applies feedback according to the trellis state transition as one bit prior (state before transition) information in the trace unit 904. For example, as shown in the trellis diagram of FIG. 2 both the state 0 and state 1 can transit to state 0, and the output path weight for the state 0 in FIG. 9, becomes one of the input path states for state 0 and state 1 in the next stage. Trace-back processing is in this way performed by making the other trace units perform the same action. The output selector 905 calculates the hard decision value SIGN (binary output) and the soft decision (or soft output) WGT from the results output from each trace unit 904.

Figure 10:
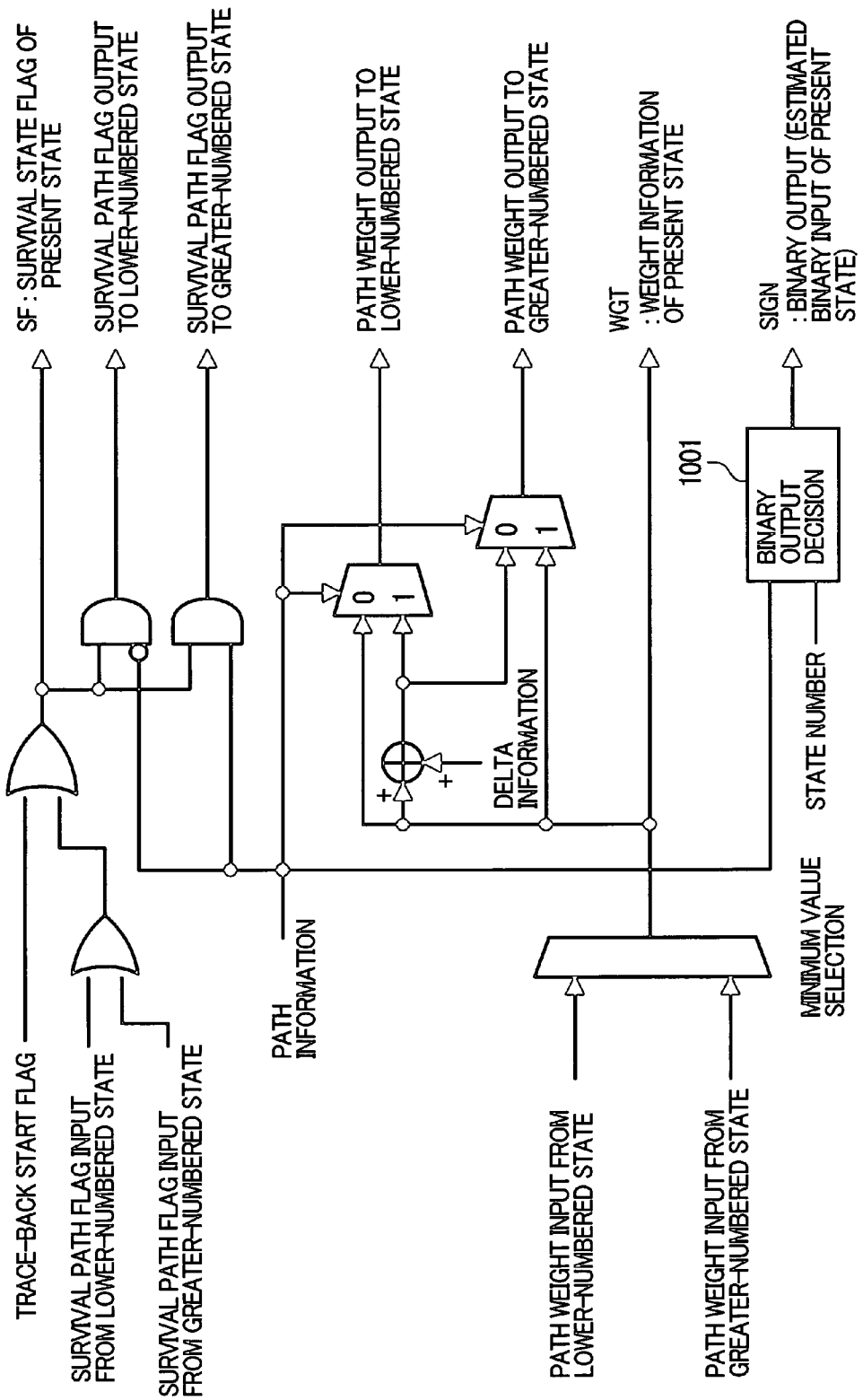
FIG. 10 is a circuit diagram of the trace-back calculator section of the turbo decoder of this invention.

FIG. 10 shows an example of the structure of the trace unit 904. The trace unit 904 possesses three functions. These functions are determining the survival state flag–survival path flag; determining the weight information (delta information), and determining the hard decision setting (binary output).

Figure 11:
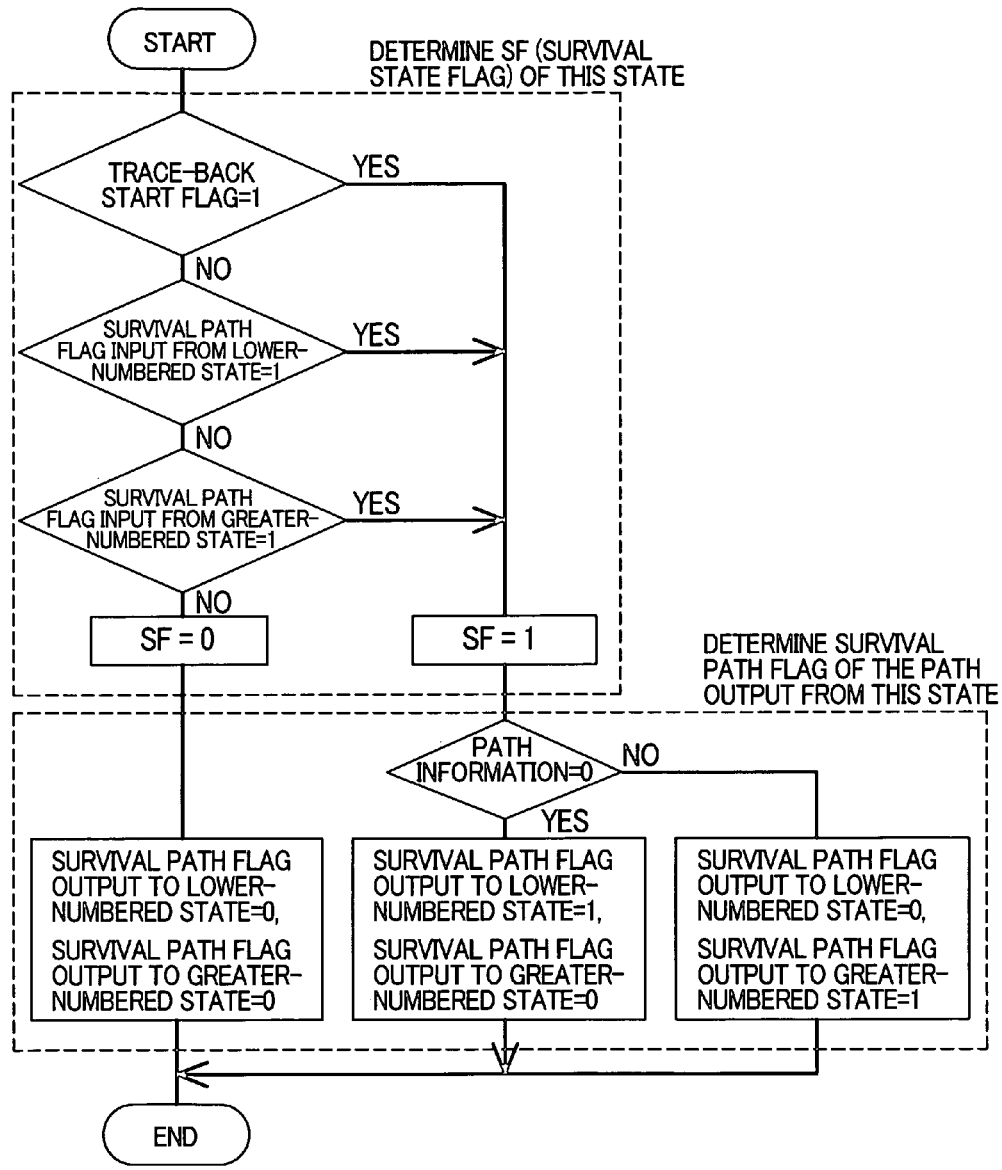
FIG. 11 is a flow chart for the algorithm for determining the survival state flag and survival path flag in the trace-back circuit.

The first function of the trace unit 904 which is determining the flags is shown in the operating flowchart in FIG. 11. First of all the survival state flag is found. When either of two input paths for trace-back to its own state are survival paths, or in order to set the survival state when the state metric is a maximum during the start of trace-back, the survival state flag is determined by the sum of their logic values. Next, the survival path flag for the output path is determined based on the survival state flag that was found. The survival path flag for the output path is set to equal one, based on path information for a state where the survival state flag equals one, and for all other paths the survival path flag is set to equal zero.

Figure 12:
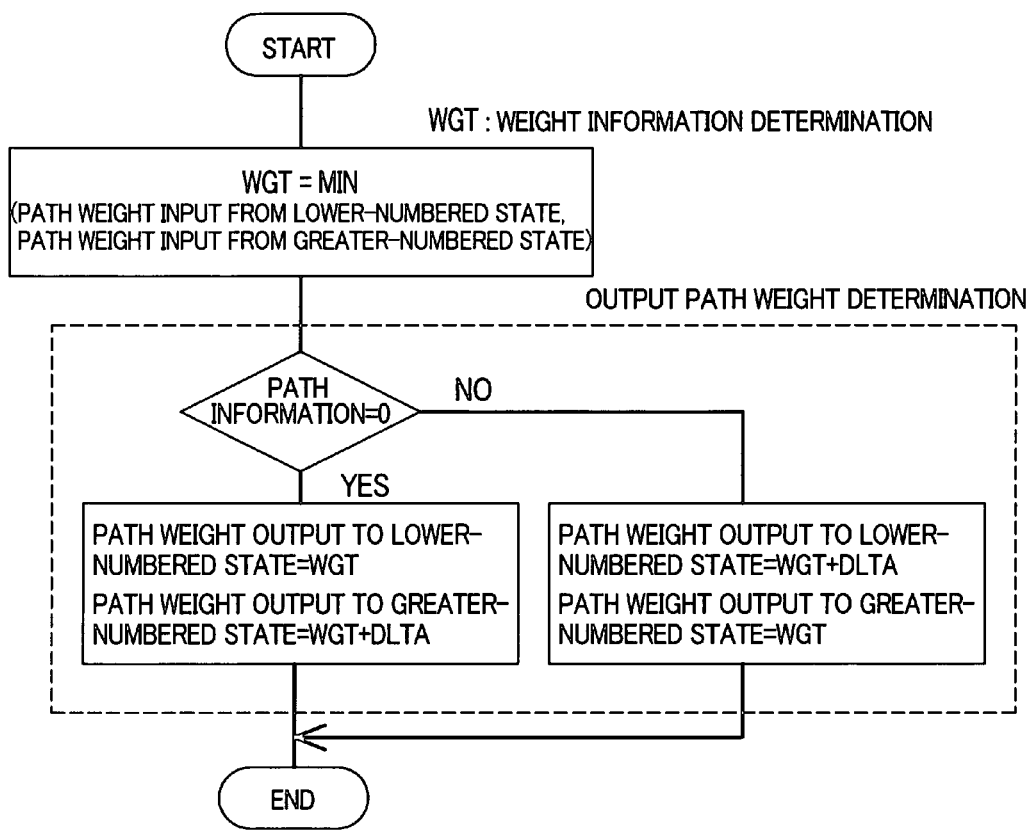
FIG. 12 is a flow chart for the algorithm for determining the path (or weight) information in the trace-back circuit.

FIG. 12 is an operation flow chart for setting the weight for the second function of the trace unit 904. First of all, the weight of the current state is determined from the path weight of the two input paths for trace-back to its own state. The smaller the path weight, the higher the reliability so that minimum values of input path weights are selected to set the weight. Next, the weights for each output path are determined by the path information and the difference in likelihood (delta information) from the delta information memory and the weight that was found. The output path weight is the weight state when conforming to path information, and is (weight state+difference in likelihood) when not conforming to path information. For example, when determining the path weight output to a lower-numbered state, the path weight is set equal to the (weight state) when the path information equals zero; and the path weight is set equal to (weight state+difference in likelihood) when the path information equals one. The weight state initial value is 0 for the survival state, and is a maximum value in all other states. In this case, the weight and the survival path weight both become zero.

The third function of the trace unit 904 is to output current state hard decision values (binary output) based on the path information. As shown in the trellis diagram in FIG. 2, the relation between the path information and hard decision values (binary output) change according to the state number so that based on the path information and state number the binary output decision 1001 determines the hard decision value and outputs it.

Figure 13:
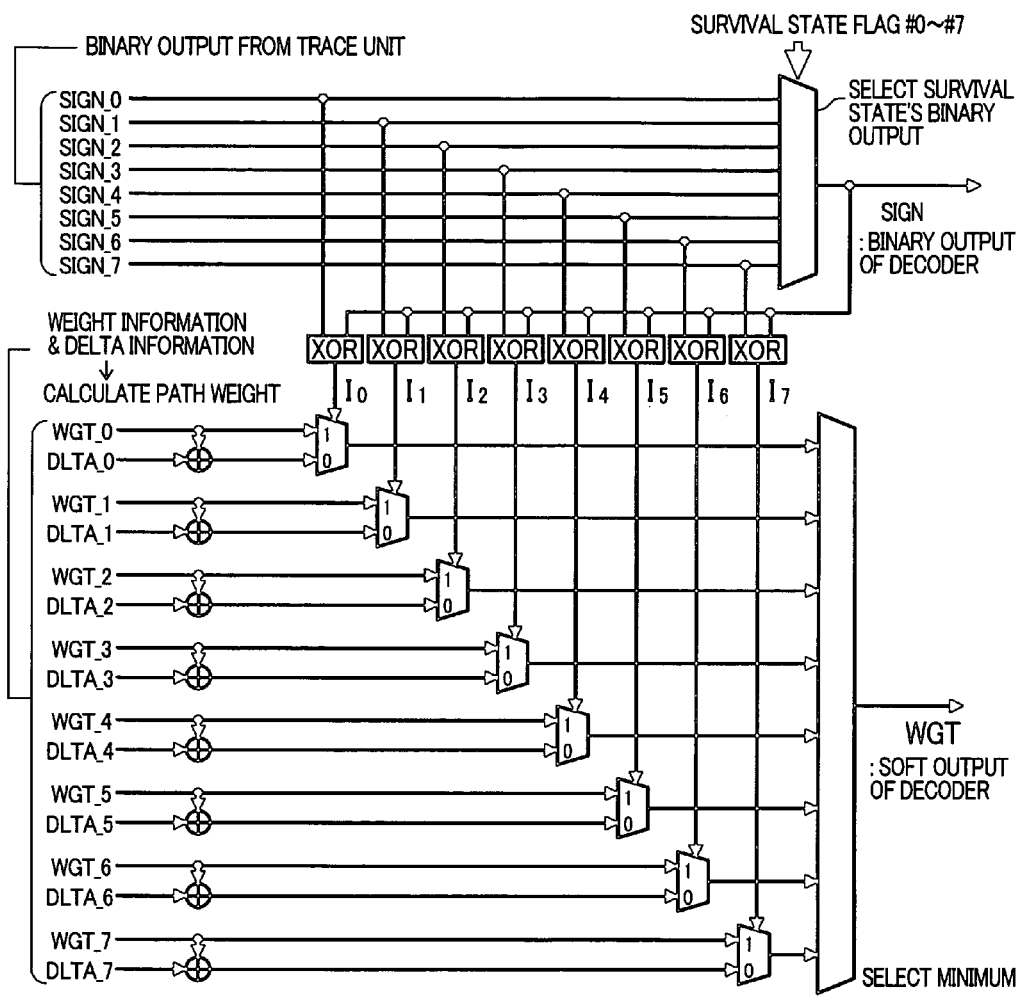
FIG. 13 shows the output selector circuit of the turbo decoder of this invention.
Figure 14:
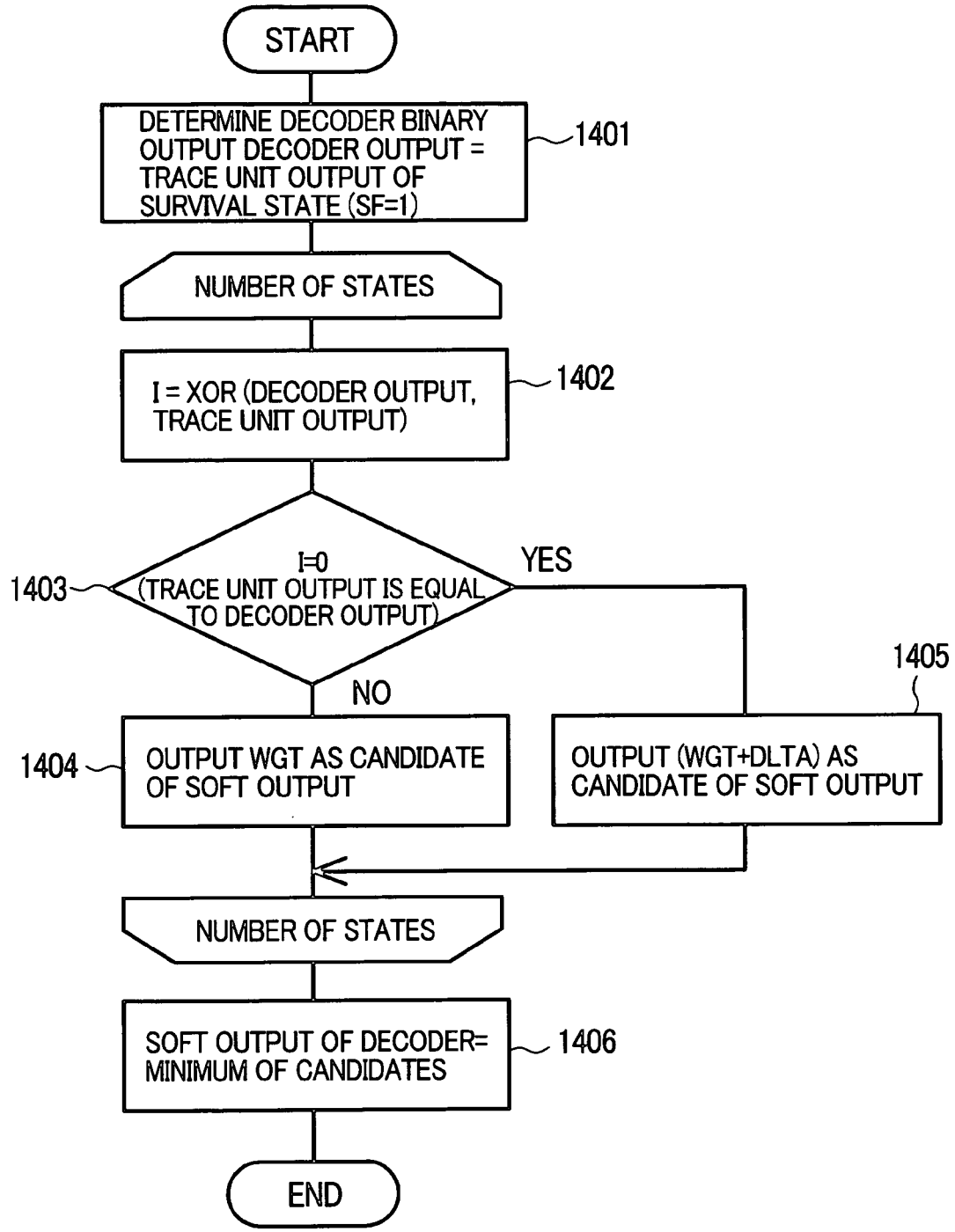
FIG. 14 is a flow chart for the algorithm for determining the soft decision output and the decoding result (output) in the output selector circuit.

FIG. 13 shows the structure of the output selector. The output selector determines the hard decision value SIGN (binary output) for that bit and the soft decision value (soft output) WGT as its path information, based on the hard decision values for each state, the survival state flag, and the path difference in likelihood. FIG. 14 is the operation flow chart. First of all, based on the survival state flag, a hard decision value for a state of SF=1 is set as the hard output SIGN (binary output) of the output selector (1401) (In other words, the decoder binary output is determined.). Next, the soft decision WGT candidates are output for each state (1402). When the WGT hard decision values for that state are different from the SIGN (Decoder output is different from survival state) 1403, the WGT is made the decoder result path (state path) 1404 (In other words, WGT is output as a soft output candidate.) When the WGT is equal to the SIGN (trace unit output equals decoder output), then path results (weight state+difference in likelihood {or WGT+DLTA}) opposing the decoder results are output (1405). The candidate values that are obtained, show the path difference in likelihood for results opposing the hard decision (binary) outputs for that bit, so those minimum values are set as the soft decision WGT output from the output selector (1406).

Figure 15:
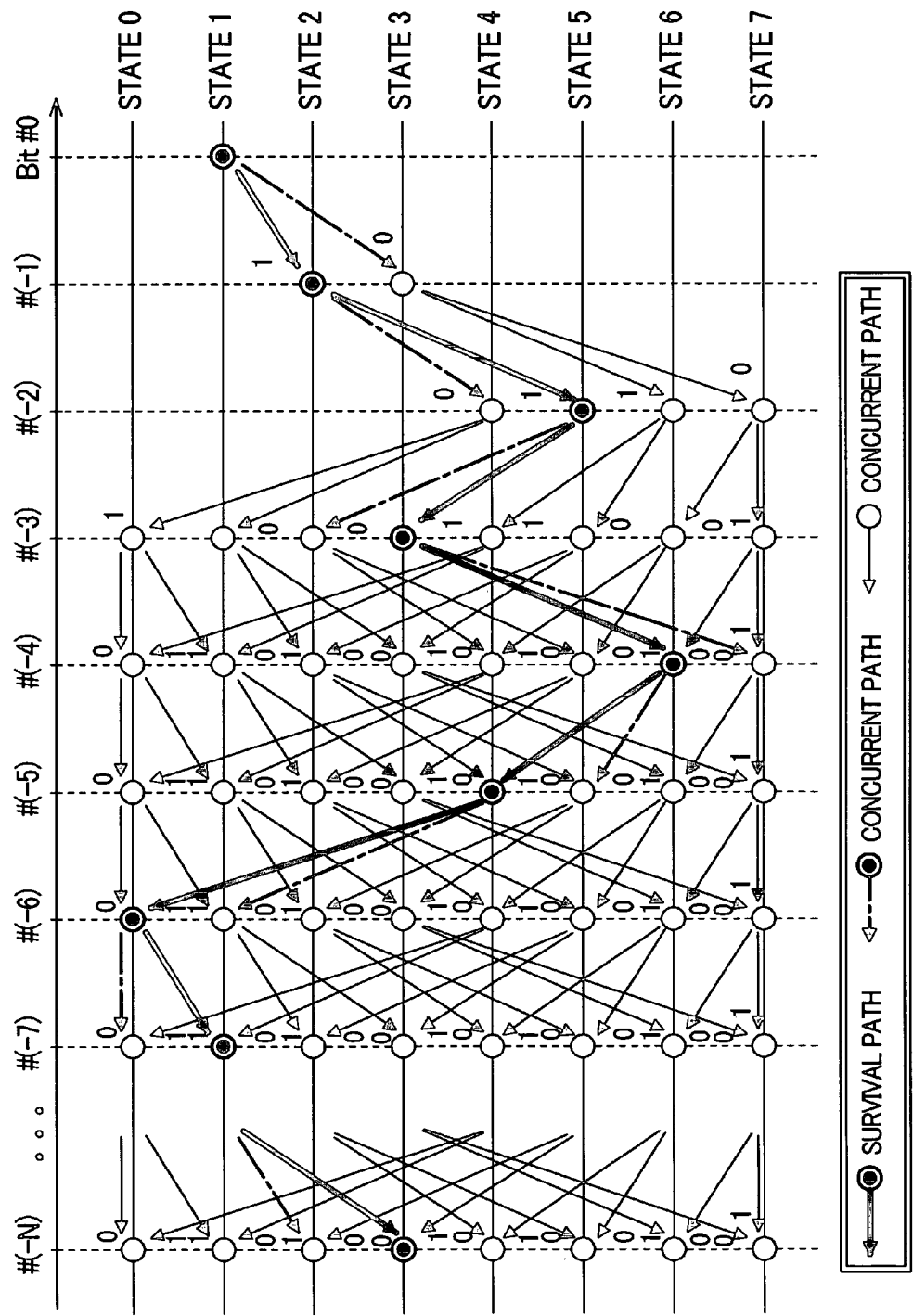
FIG. 15 is an overall concept diagram of the trace-back processing in this invention.

The state of the trace-back in the above described configuration is shown in FIG. 15. The paths and opposing paths are output according to the path information from each state, and all output paths per transitions between bits are considered. The number of output paths increases per one bit transition however there are paths converging towards the same state, and thereafter there is no need to trace back on paths with lower reliability (will not become output candidates since reliability is always worse on other side.) so that the number of required trace-back circuits is limited to the number of states.

What is claimed is:

1. An error correction decoder for performing soft-decision Viterbi algorithm (SOVA) decoding of coded data output by a convolutional coder which generates the coded data according to changes in the among multiple tap states at each input of a bit signal, said error correction decoder comprising:
    an add compare select (ACS) circuit;
    a state metric memory for storing metric values found by the ACS circuit;
    a path information memory for storing path information;
    a Delta information memory for storing Delta information computed from a difference in likelihoods,
    wherein the ACS circuit calculates new metric values, the path information and the difference in likelihood based on the metric values stored in the state metric memory and a likelihood of each transition branch describing a transition structure of the tap state; and a trace-back processor for tracing back transitions of the tap state through the coded data output by the convolutional coder, wherein the trace-back processor includes circuitry which calculates a first path likelihood information equivalent to the difference in likelihood of a survival path among all other concurrent paths based on inputted path likelihood information, and calculates second path likelihood information which value is different from said first path likelihood information by a Delta information value corresponding to the difference in likelihood stored in the Delta information memory, and establishes hard decision values and soft decision values for each one bit trace-back, and wherein the trace-back processor includes circuitry which receives previously calculated path and Delta information and determines path weight information from the previously calculated path and Delta information, outputs, hard decision values that are a code estimated to have been input to the convolutional coder during transitions from survival path to survival path at tap states of a Trellis during trace-back; and a first multiplexer which outputs a survival hard decision output selected from the hard decision values to an XOR gate;

and a second multiplexer that is controlled by the output of the XOR gate which, from among concurrent paths having hard decision values different from those of a survival path at a particular tap state of a Trellis, selects and outputs a minimum value of previously calculated path weight information as the soft decision value.

2. The error correction decoder according to claim 1, wherein the circuitry of the trace-back processor includes trace-back calculator modules equal in number to the number of the tap states, and each calculator module calculates the path weight information.

3. The error correction decoder according to claim 2, wherein the trace-back calculator module inputs one input that is a one-bit prior output of a trace-back calculator module.

4. The error correction decoder according to claim 2, wherein the trace-back calculator module calculates the first path likelihood information equivalent to the difference in likelihood of a survival path among all other concurrent paths, and utilizes that information to calculate the second path likelihood information.

5. The error correction decoder according to claim 2, wherein the trace-back calculator module selects the output path likelihood information from the first path likelihood information, and the sum of the first path likelihood information and the difference in likelihood when selecting a path in that tap state.

6. The error correction decoder according to claim 1, wherein the circuitry of the trace-back processor includes trace-back calculator modules equal in number to the number of the tap states, and each calculator module calculates the first path likelihood information.

7. The error correction decoder according to claim 6, wherein the trace-back calculator module calculates the first path likelihood information equivalent to the difference in likelihood of a survival path among all other concurrent paths, and utilizes that information to calculate the second path likelihood information.

* * * * *